(12) United States Patent
Hong et al.

(10) Patent No.: US 12,727,329 B2
(45) Date of Patent: Sep. 1, 2026

(54) LIGHT EMITTING DISPLAY APPARATUS INCLUDING MULTIPLE PATTERNS

(71) Applicant: LG Display Co., Ltd., Seoul (KR)

(72) Inventors: Sunggon Hong, Gimpo-si (KR); Jaehee Kim, Ulsan (KR); Soonho Kwon, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 645 days.

(21) Appl. No.: 17/993,684

(22) Filed: Nov. 23, 2022

(65) Prior Publication Data

US 2023/0172006 A1 Jun. 1, 2023

(30) Foreign Application Priority Data

Dec. 1, 2021 (KR) ........................ 10-2021-0170053

(51) Int. Cl.

*H10K 59/12* (2023.01)
*G06F 3/044* (2006.01)
*H10K 59/122* (2023.01)
*H10K 59/40* (2023.01)
*H10K 59/65* (2023.01)
*H10K 50/844* (2023.01)

(52) U.S. Cl.

CPC ......... *H10K 59/122* (2023.02); *G06F 3/0447* (2019.05); *H10K 59/40* (2023.02); *H10K 59/65* (2023.02); *H10K 50/844* (2023.02)

(58) Field of Classification Search

CPC ...... H10K 59/122; H10K 59/40; H10K 59/65; H10K 59/873; H10K 59/131; H10K 59/124; H10K 50/844; G06F 3/0447

See application file for complete search history.

(56) References Cited

U.S. PATENT DOCUMENTS

| | | | | |
|---|---|---|---|---|
| 11,106,299 | B2 | 8/2021 | Lee et al. | |
| 2018/0033830 | A1 | 2/2018 | Kim et al. | |
| 2018/0033998 | A1 | 2/2018 | Kim et al. | |
| 2019/0004654 | A1 | 1/2019 | Gwon et al. | |
| 2019/0252639 | A1* | 8/2019 | Lee | H10K 50/8426 |
| 2019/0288234 | A1 | 9/2019 | Kim et al. | |
| 2020/0136087 | A1* | 4/2020 | Kim | H10K 59/122 |
| 2020/0161398 | A1 | 5/2020 | Bang et al. | |
| 2020/0161406 | A1* | 5/2020 | Lee | G09G 3/006 |
| 2020/0168823 | A1* | 5/2020 | Kim | H10K 50/844 |
| 2020/0176538 | A1* | 6/2020 | Um | H10K 59/126 |
| 2020/0212114 | A1* | 7/2020 | Song | G06F 3/0446 |

(Continued)

FOREIGN PATENT DOCUMENTS

| | | |
|---|---|---|
| CN | 107665950 A | 2/2018 |
| CN | 109213364 A | 1/2019 |

(Continued)

*Primary Examiner* — Ida M Soward

(74) *Attorney, Agent, or Firm* — Birch, Stewart, Kolasch & Birch, LLP

(57) ABSTRACT

Discussed is a light emitting display apparatus that can include a substrate including an active area and a non-active area adjacent to the active area, a planarization layer disposed in the active area and in a first part of the non-active area, a light emitting diode layer and a first pattern disposed on the planarization layer, a protection layer disposed on the light emitting diode layer and the first pattern, and a second pattern disposed in a second part adjacent to the first part of the non-active area.

24 Claims, 8 Drawing Sheets

(56) References Cited

U.S. PATENT DOCUMENTS

2020/0295310 A1* 9/2020 Moon .................... H10K 59/38
2020/0363905 A1* 11/2020 Jo .......................... G06F 3/0448
2020/0371549 A1* 11/2020 Park ...................... G06F 3/0412
2020/0409485 A1* 12/2020 Gwon ................... G06F 3/0443
2020/0409498 A1* 12/2020 Rhe ....................... G06F 3/0412
2021/0005696 A1* 1/2021 Bang .................... H10K 59/131
2021/0020733 A1* 1/2021 Saida .................... H05B 33/22
2021/0026479 A1* 1/2021 Lee ....................... G06F 3/0443
2021/0036022 A1 2/2021 Han et al.
2021/0043715 A1* 2/2021 Han ....................... H10K 59/40
2021/0048907 A1* 2/2021 Rhe ..................... G06F 3/04164
2021/0055816 A1* 2/2021 An ..................... H10K 59/8731
2021/0091320 A1* 3/2021 Choi .................... H10K 59/131
2021/0111371 A1 4/2021 Cho et al.
2021/0126057 A1 4/2021 Seo et al.
2021/0134924 A1 5/2021 Ha et al.
2021/0141479 A1 5/2021 Lee et al.
2021/0200364 A1 7/2021 Won et al.
2021/0200379 A1* 7/2021 Youk .................... H01Q 1/2266
2021/0280642 A1* 9/2021 Lee ........................ H10K 59/12
2021/0336214 A1 10/2021 Bang et al.
2022/0029130 A1* 1/2022 Seo ...................... H10K 59/131
2022/0059641 A1* 2/2022 Na ..................... H10K 59/1213
2022/0102678 A1* 3/2022 Kim ................. H10K 59/80521
2022/0115625 A1* 4/2022 Yu ........................ H10K 77/111
2022/0140057 A1* 5/2022 Kanehiro ............... H05B 33/14
257/40
2023/0263032 A1* 8/2023 Lee .................... H10K 59/8731
345/173
2025/0048875 A1* 2/2025 Lee ...................... H10K 50/844

FOREIGN PATENT DOCUMENTS

CN 111192882 A 5/2020
CN 105609521 B 1/2021
CN 112349758 A 2/2021
CN 112670318 A 4/2021
EP 3525240 A1 * 8/2019 ........... G06F 3/0412
EP 4192215 A1 6/2023
JP 2019-91642 A 6/2019
JP 2020-35704 A 3/2020
JP 2020-71942 A 5/2020
JP 2020-194154 A 12/2020
JP 2021-34282 A 3/2021
JP 7493013 B2 5/2024
KR 10-2018-0014396 A 2/2018
KR 10-2018-0047295 A 5/2018
KR 10-2021-0017297 A 2/2021
KR 20210035959 A * 4/2021 ........... H10K 59/131
KR 10-2021-0052728 A 5/2021
KR 20210058528 A * 5/2021 ........... H10K 59/873
KR 10-2023-0082281 A 6/2023
TW I850886 B 8/2024

* cited by examiner

LIGHT EMITTING DISPLAY APPARATUS INCLUDING MULTIPLE PATTERNS

CROSS-REFERENCE TO RELATED APPLICATION

This application claims priority to Korean Patent Application No. 10-2021-0170053 filed on Dec. 1, 2021, in the Korean Intellectual Property Office, the entire contents of which are hereby expressly incorporated herein by reference into the present application.

BACKGROUND OF THE DISCLOSURE

Field

The present disclosure relates to a light emitting display apparatus, and more particularly, to a light emitting display apparatus which controls a flow of a protection layer disposed on a light emitting diode layer and which improves the sensitivity of a touch line disposed in an outer peripheral area of the light emitting display apparatus.

Description of the Related Art

A display apparatus capable of displaying various information and interacting with a user who views such information needs to have various sizes, various shapes, and various functions.

Examples of a display apparatus include a liquid crystal display device (LCD), an electrophoretic display device (FPD), and a light emitting display apparatus.

The light emitting display apparatus is a self-emitting display device in which a separate light source is not necessary, unlike the liquid crystal display device (LCD). Therefore, the light emitting display apparatus can be manufactured to have light weight and small thickness.

Further, since the light emitting display apparatus is driven at a low voltage, it is advantageous not only in terms of power consumption, but also in the color implementation, the response speed, the viewing angle, and the contrast ratio (CR), so that it is being studied as the next generation display.

When the light emitting display apparatus is an organic light emitting display apparatus, the light emitting diode layer can be an organic light emitting diode layer including an anode, an emission layer, and a cathode. In addition, as the light emitting diode layer, a quantum-dot light emitting diode (QLED) including quantum dots (QD) can be further used. Hereinafter, even though the description will be made under the assumption that the light emitting display apparatus is the organic light emitting display apparatus, the type of the light emitting diode layer is not limited thereto.

The organic light emitting display apparatus displays information on a screen by emitting light from a plurality of pixels including a light emitting diode layer having an emission layer.

The organic light emitting display apparatus can be classified into an active matrix type organic light emitting diode display (AMOLED) or a passive matrix type organic light emitting diode display (PMOLED) depending on a method of driving a pixel.

The active matrix type organic light emitting diode display (AMOLED) controls a current flowing in an organic light emitting diode using a thin film transistor (TFT) to display images.

The active matrix type organic light emitting diode display includes various thin film transistors such as a switching thin film transistor, a driving TFT connected to the switching TFT, and an organic light emitting diode (OLED) connected to the driving TFT.

A gate electrode, a source electrode, a drain electrode, and a semiconductor layer which configure various TFTs having various purposes. Here, a large number of electrode lines connected thereto are disposed and a planarization layer is provided on the thin film transistor.

A light emitting diode layer can be disposed on the planarization layer. The light emitting diode layer can include an anode electrode (anode) which is a pixel electrode, an emission layer, and a cathode electrode (cathode).

The organic light emitting display apparatus uses an organic material for the emission layer. During the process of injecting electrons and holes into the emission layer configured by the organic material through two electrodes (for example, the anode electrode and the cathode electrode) so that the electrons and the holes are met on the emission layer to be recombined, excitons are formed and the light is emitted due to the energy from the excitons.

The electrons and holes are injected through the anode electrode which is a pixel electrode and the cathode electrode which is a common electrode. In order to more smoothly inject the electrons and the holes, the organic layer can include a hole injection layer, a hole transport layer, an electron transport layer, and an electron injection layer and can have a multilayered structure thereof.

The organic light emitting display apparatus, however, can have some limitations in that there may be deterioration due to internal factors such as deterioration of the electrode and the emission layer due to oxygen or deterioration by the reaction between the emission layer-interface and deterioration due to external factors such as moisture, oxygen, and ultraviolet rays from the outside. Therefore, packaging and encapsulation of the organic light emitting display apparatus are important.

In this regard, a protection layer including at least one inorganic layer and at least one organic layer can be formed to protect the light emitting diode layer.

An organic material which configures the protection layer is configured by a polymer material and is formed by a hardening process after being applied on the substrate as a liquid. The organic material has a fluidity before the hardening process so that there can be a limitation in that a liquid polymer which configures the organic material intrudes into an area in which a driving circuit is formed in an outer periphery of the substrate to cause a driving failure or a defect.

In order to provide more various useful functions to the users using the light emitting display apparatus, a touch display apparatus has been developed, which provides a touch-based input method to allow the users to intuitively and easily input information or instructions by avoiding the usual input method such as a button, a keyboard, or a mouse.

One way to provide a touch display apparatus is to provide a plurality of touch lines is disposed on the protection layer to detect the presence of touch or the touch coordinate based on the change in the capacitance formed in the plurality of touch lines formed on a substrate.

A planarization layer, an insulating layer, and a metal line which are disposed below the protection layer in an outer peripheral area of the light emitting display apparatus are etched so that steep inclinations and steps can be formed. Therefore, there may be limitations in that the edge of the protection layer is not applied with the protection layer or a thickness thereof is sharply reduced. Accordingly, there may be a limitation in that a touch sensitivity of the touch line disposed on the protection layer in the outer peripheral area of the light emitting display apparatus is lowered.

Consequently, even though various reviews have been performed to control the flow of the protection layer of the light emitting display apparatus and improve the touch sensitivity in the outer peripheral area of the light emitting display apparatus, it can be still insufficient so that development thereof is needed.

SUMMARY OF THE DISCLOSURE

An object to be achieved by the present disclosure is to provide a light emitting display apparatus including a first pattern to more efficiently control the flow of the second protection layer included in the light emitting display apparatus.

Another object to be achieved by the present disclosure is to provide a light emitting display apparatus having a thin bezel by minimizing a design margin of a second protection layer by controlling a flow of the second protection layer of the light emitting display apparatus.

Still another object to be achieved by the present disclosure is to provide a light emitting display apparatus which improves a display quality by minimizing an electric field interference of electrodes disposed above and below the protection layer by improving a thickness of the protection layer in an outer peripheral area.

Still another object to be achieved by the present disclosure is to provide a light emitting display apparatus which improves a touch sensitivity in an outer peripheral area of the light emitting display apparatus including a touch line formed on a protection layer by minimizing a step and a curve of an upper surface of the protection layer.

Objects of the present disclosure are not limited to the above-mentioned objects, and other objects, which are not mentioned above, can be clearly understood by those skilled in the art from the following descriptions.

According to an aspect of the present disclosure, a light emitting display apparatus includes a substrate including an active area and a non-active area adjacent to the active area; a planarization layer disposed in the active area and a first part of the non-active area; a light emitting diode layer and a first pattern disposed on the planarization layer; a protection layer disposed on the light emitting diode layer and the first pattern; and a second pattern disposed in a second part adjacent to the first part of the non-active area.

According to another aspect of the present disclosure, a light emitting display apparatus includes a substrate including an active area and a non-active area adjacent to the active area; a planarization layer disposed in the active area and a first part of the non-active area; a light emitting diode layer and a first pattern disposed on the planarization layer; a protection layer disposed on an organic light emitting diode in the light emitting diode layer and the first pattern; a second pattern disposed in a second part adjacent to the first part of the non-active area; and a touch line disposed on the protection layer.

According to yet aspect of the present disclosure, a light emitting display apparatus includes an active area and a non-active area adjacent to the active area; a light emitting diode layer disposed in the active area; a first pattern disposed in a first part of the non-active area; a protection layer disposed on the light emitting diode layer and the first pattern; a second pattern disposed in a second part adjacent to the first part of the non-active area; and a hole disposed in the first part of the non-active area.

Other detailed matters of the example embodiments are included in the detailed description and the drawings.

According to the example embodiment of the present disclosure, the light emitting display apparatus configures a first pattern so that the first pattern controls a flow of the second protection layer to minimize the overflowing of the second protection layer to an area in which a driving circuit is formed, thereby improving a display quality and a stability.

According to the example embodiment of the present disclosure, the light emitting display apparatus configures a first pattern so that a design margin is minimized in consideration of an area in which the second protection layer spreads (or flows) to provide a thin bezel.

According to the example embodiment of the present disclosure, the light emitting display apparatus configures a first pattern so that a thickness of the protection layer disposed in a non-active area NA adjacent to an active area is improved to efficiently block moisture and oxygen from entering from a side surface of the light emitting display apparatus.

According to the example embodiment of the present disclosure, the light emitting display apparatus configures a first pattern so that a thickness of the protection layer in a non-active area adjacent to an active area is improved to minimize the electric field interference of the electrodes disposed above and below the protection layer, thereby improving a display quality.

According to the example embodiment of the present disclosure, the light emitting display apparatus minimizes a step and a curve on an upper surface of the protection layer to suppress the loss of the touch line, thereby improving a touch sensitivity of an outer peripheral area of the light emitting display apparatus.

According to an example embodiment of the present disclosure, a light emitting display apparatus can include a substrate including an active area and a non-active area enclosing the active area; a planarization layer in the active area, and partially intruding into the non-active area; a protection layer in the active area, and partially intruding into the non-active area; and a first pattern interposed between the planarization layer and the protection layer, and disposed in the non-active area.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
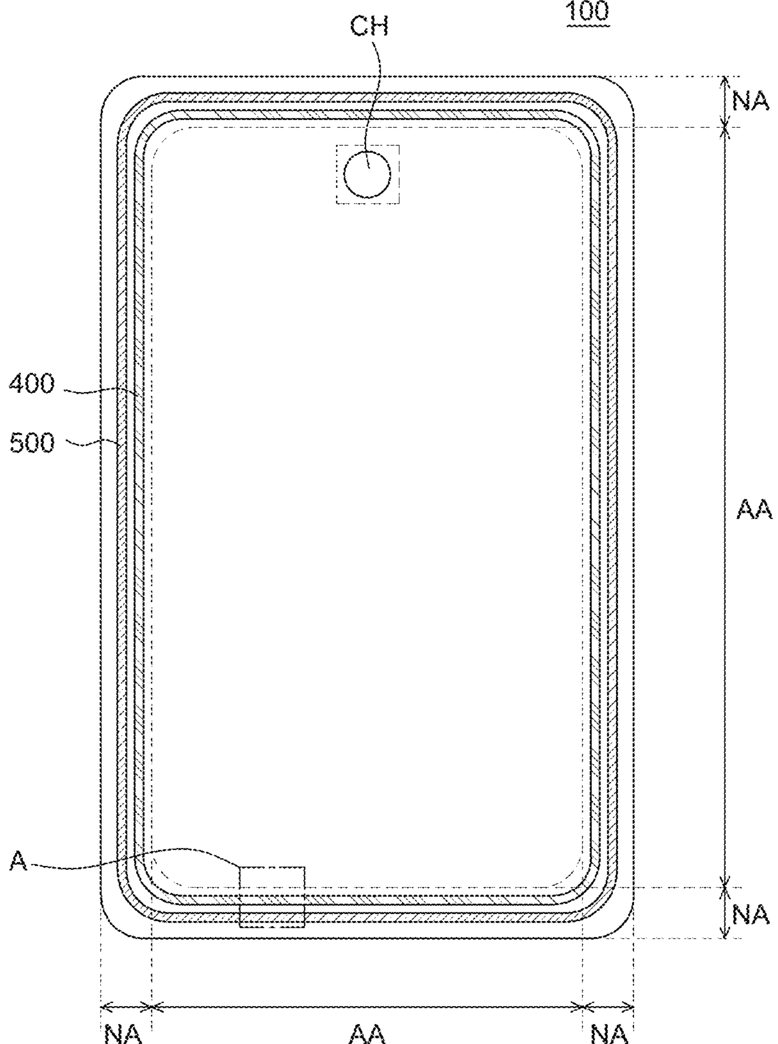
FIG. 1 is a plan view of a light emitting display apparatus according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as “including,” “having,” and “consist of” used herein are generally intended to allow other components to be added unless the terms are used with the term “only”. Any references to singular can include plural unless expressly stated otherwise.

Components are interpreted to include an ordinary error range even if not expressly stated.

When the position relation between two parts is described using the terms such as “on”, “above”, “below”, and “next”, one or more parts can be positioned between the two parts unless the terms are used with the term “immediately” or “directly”. When an element or layer is disposed “on” another element or layer, another layer or another element can be interposed directly on the other element or therebetween.

When the time relation is described using the terms such as “after”, “following”, “next”, and “before”, non-continuous cases are included unless the terms are used with the term “immediately” or “directly”.

Although the terms “first”, “second”, and the like are used for describing various components, these components are not confined by these terms. These terms are merely used for distinguishing one component from the other components. Therefore, a first component to be mentioned below can be a second component in a technical concept of the present disclosure.

In describing components of the example embodiment of the present disclosure, terminologies such as first, second, A, B, (a), (b), and the like can be used. The term is used to distinguish a component from the other component but a nature, an order, or the number of the components is not limited by the terminology. When a component is “linked”, “coupled”, or “connected” to another component, the component can be directly linked or connected to the other component. However, unless specifically stated otherwise, it should be understood that a third component can be interposed between the components which can be indirectly linked or connected.

It should be understood that “at least one” includes one or more all combinations of associated components. For example, “at least one of first, second, and third components” means that not only a first, second, or third component, but also all combinations of two or more of first, second, and third components are included.

In the present disclosure, “apparatus” can include a display apparatus which includes a display panel and a driver for driving the display panel, such as a liquid crystal module (LCM) or an organic light emitting display module (OLED module). Further, the “apparatus” can further include a set electronic device or a set device (or a set apparatus) which is a complete product (or a final product) including an LCM, or an OLED module, such as a notebook computer, a television, or a computer monitor, an automotive display or equipment display including another type of vehicle and a mobile electronic device including a smart phone or an electronic pad.

Accordingly, the apparatus of the present disclosure can include not only a display apparatus itself such as an LCM, or an OLED module, but also an applied product or a set apparatus which is a final consumer device including the LCM, the OLED module, or the like.

In some example embodiments, the LCM or the OLED module configured by the display panel and the driver is represented as a “display apparatus” and an electronic apparatus as a complete product including the LCM or the OLED module is represented as a “set apparatus”. For example, the display apparatus can include a liquid crystal (LCD) or an organic light emitting (OLED) display panel and a source PCB which is a controller for driving the display panel. The set apparatus can further include a set PCB as a set controller which is electrically connected to the source PCB to drive the entire set apparatus.

As the display panel used in the example embodiment of the present disclosure, any type of display panel such as a liquid crystal display panel, an organic light emitting diode (OLED) display panel, and an electroluminescent display panel can be used, but the example embodiment is not limited thereto. For example, the display panel can be a display panel which is vibrated by a vibrating device according to an example embodiment of the present disclosure to generate a sound. The display panel applied to the display apparatus according to the example embodiment of the present disclosure is not limited to a shape or a size of the display panel.

The features of various embodiments of the present disclosure can be partially or entirely adhered to or combined with each other and can be interlocked and operated in technically various ways, and the embodiments can be carried out independently of or in association with each other.

Hereinafter, the example embodiment of the present disclosure will be described with reference to the accompanying drawings and examples as follows. Scales of components illustrated in the accompanying drawings are different from the real scales for the purpose of description, so that the scales are not limited to those illustrated in the drawings.

Hereinafter, various example embodiments of the present disclosure will be described in detail with reference to accompanying drawings. All the components of each light emitting display apparatus according to all embodiments of the present disclosure are operatively coupled and configured.

Figure 2:
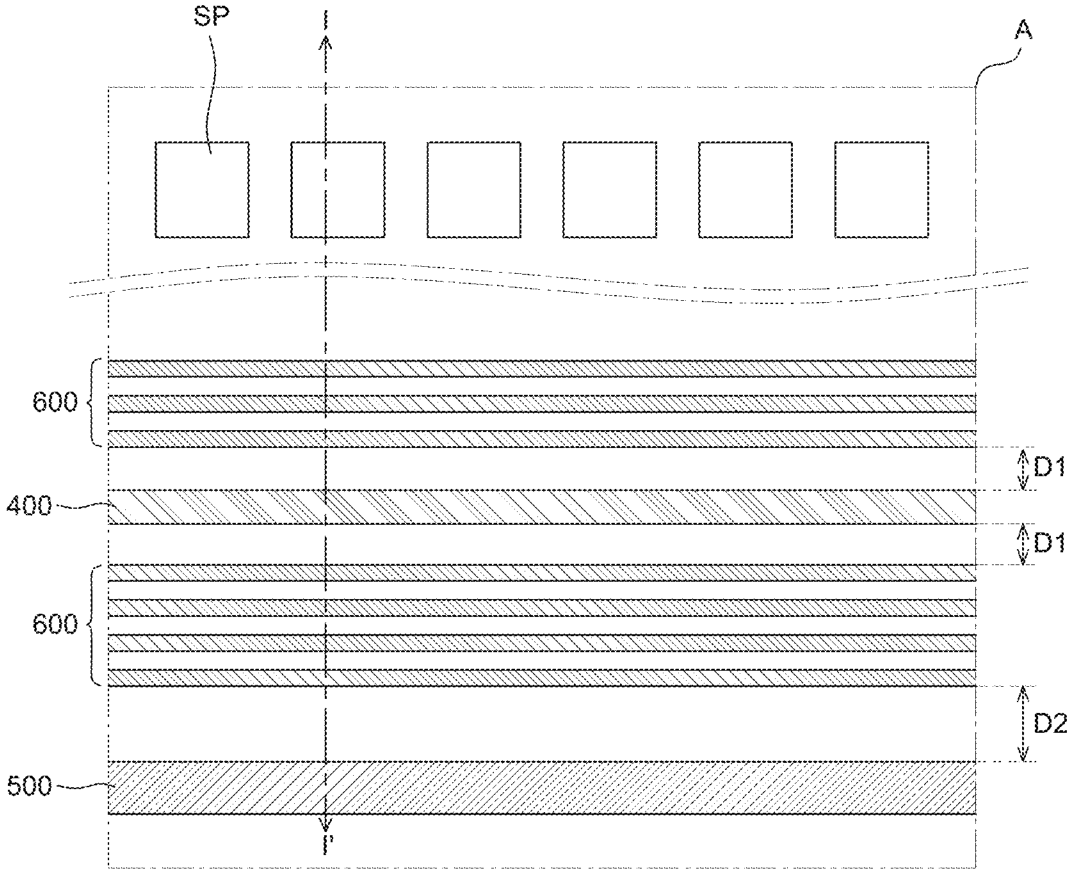
FIG. 2 is an enlarged plan view of an outer peripheral area of the light emitting display apparatus in FIG. 1.
Figure 3:
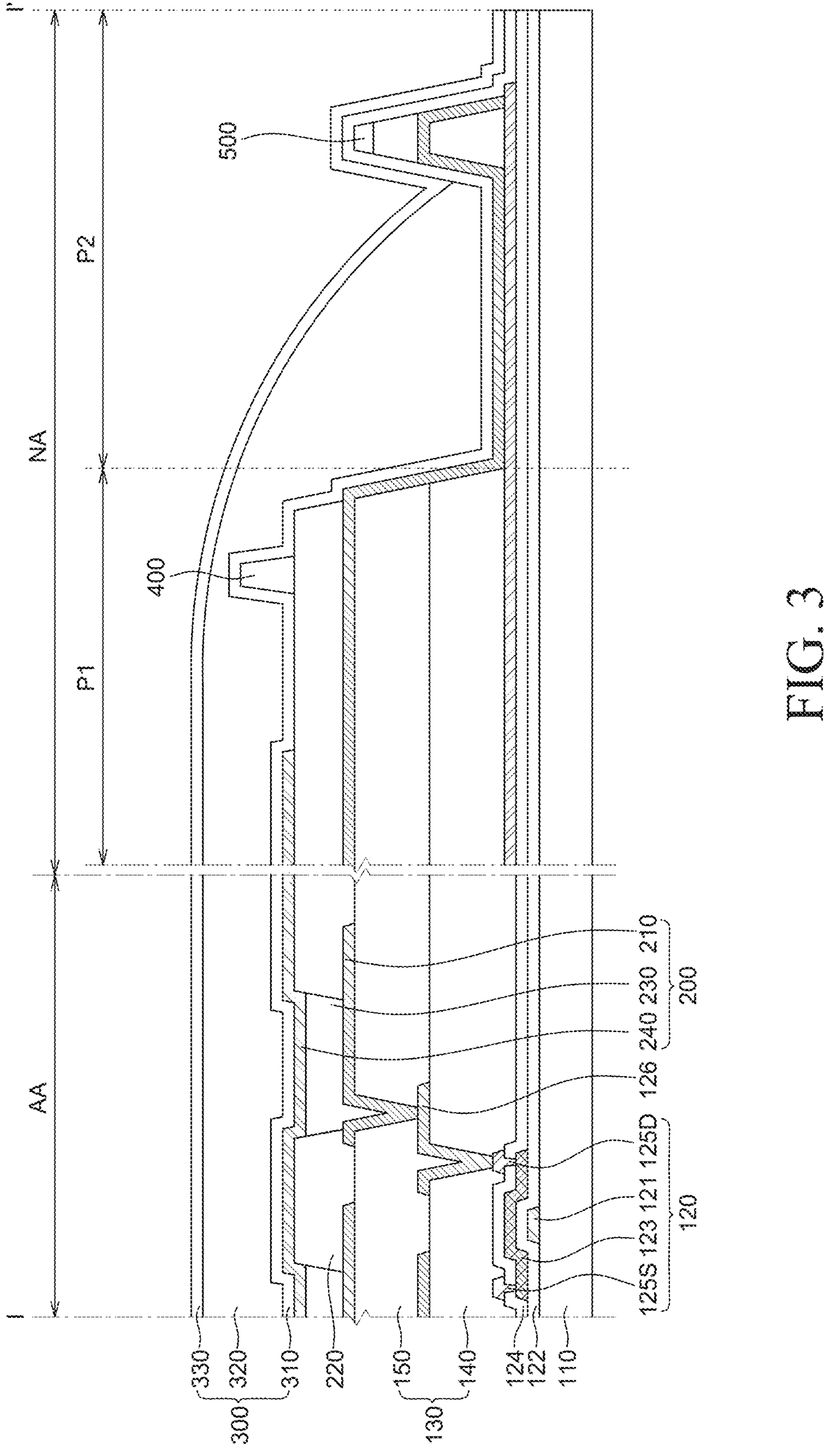
FIG. 3 is a cross-sectional view of a light emitting display apparatus according to an example embodiment of the present disclosure.

FIG. 1 is a plan view of a light emitting display apparatus according to an example embodiment of the present disclosure. FIG. 2 is an enlarged plan view of an outer peripheral area in FIG. 1. FIG. 3 is a cross-sectional view taken along the line I-I' of FIG. 2.

Referring to FIGS. 1, 2 and 3, a light emitting display apparatus 100 according to an example embodiment of the present disclosure includes a substrate 110, a light emitting diode layer 200, a first pattern 400, and a second pattern 500. Further, it is to be understood that the light emitting display apparatus 100 includes a plurality of gate lines, a plurality of data lines, and other elements including a plurality of thin film transistors (TFT) that are connected to a plurality of pixels and/or a plurality sub pixels SP that enable light emitting display apparatus 100 to properly operate.

Accordingly, the light emitting display apparatus 100 can further include various additional elements to generate various signals or drive a plurality of sub pixels SP in an active area AA. The additional elements for driving the sub pixels SP can include an inverter circuit, a multiplexer, or an electrostatic discharge (ESD) circuit. The light emitting display apparatus 100 can also include an additional element associated with a function other than the sub pixel (SP) driving function. For example, the light emitting display apparatus 100 can include additional elements which provide a touch sensing function, a user authentication function (for example, fingerprint recognition), a multilevel pressure sensing function, or a tactile feedback function. The above-mentioned additional elements can be located in the non-active area NA or an external circuit which is connected to the connecting interface.

Referring to FIGS. 1, 2, and 3, the substrate 110 can include an active area AA and a non-active area NA. The non-active area NA of the substrate is adjacent to the active area AA and disposed outward from the active area AA.

The outer peripheral area A can be an edge area of the substrate 110. For example, the outer peripheral area A can include an end (or one side) of the active area AA and the non-active area NA.

Further, the outer peripheral area A can include a data driving circuit, a driving circuit which supplies a signal to the plurality of sub pixels SP, and a sensor circuit which senses the presence of the abnormality of the signal line connected to the driving circuit. The data driving circuit supplies a data signal to a sub pixel SP located at one end (or one side) of the active area AA and a plurality of sub pixels SP disposed in the non-active area NA disposed at the outside of the active area AA. The outer peripheral area A can be a peripheral part, but it is not limited to the terminology.

The active area AA is an area where a plurality of sub pixels SP is disposed to display images. Each of the plurality of sub pixels SP is an individual unit which emits light and in each of the plurality of sub pixels SP, a light emitting diode and a driving circuit are formed. For example, in the plurality of sub pixels SP, a display element for displaying images and a circuit unit for driving the display element can be disposed. The plurality of sub pixels SP can include a red sub pixel SP, a green sub pixel SP, a blue sub pixel SP and/or a white sub pixel SP, but is not limited thereto.

One or each sub pixel SP can include a plurality of transistors, a capacitor and a plurality of wiring lines. For example, the sub pixel SP can be configured by two transistors and one capacitor (2T1C), but is not limited thereto, and can be implemented as a sub pixel to which 4T1C, 7T1C, 6T2C, or the like is applied.

The non-active area NA is an area where no image is displayed and various wiring lines and driving circuits for driving the plurality of sub pixels SP disposed in the active area AA can be disposed. For example, in the non-active area NA, various ICs such as a gate driver IC and a data driver IC and driving circuits can be disposed. The non-active area NA in which images are not displayed can be an area in which images are not displayed. For example, the non-active area NA can be referred to as a bezel area or a bezel, but the non-active area is not limited to only such terminology.

The non-active area NA can be an area which encloses the active area AA as illustrated in FIG. 1. The non-active area NA can be an area extending from the active area AA. Alternatively, the non-active area NA can be an area in which a plurality of sub pixels SP is not disposed, but is not limited thereto.

The active area AA can be referred to as a display area and the non-active area NA can be represented as a bezel area, but are not limited to such terminologies.

Even though in FIG. 1, it is illustrated that the non-active area NA encloses a quadrangular active area AA, a shape of the active area AA and a shape and placement of the non-active area NA adjacent to the active area AA are not limited to the example illustrated in FIG. 1. The active area AA and the non-active area NA can have shapes suitable for a design of an electronic device including the light emitting display apparatus 100. For example, an example shape of the active area AA can be a pentagon, a hexagon, a circle, an oval, or the like, but is not limited thereto.

The non-active area NA can include a first part P1 and a second part P2.

The first part P1 of the non-active area NA can be an area which encloses the active area AA. The first part P1 of the non-active area NA can be a part adjacent to the active area AA in the non-active area NA. The first part P1 of the non-active area NA can be a part disposed between the active area AA and the second part P2 of the non-active area NA. The first part P1 of the non-active area NA can be an area in which a planarization layer 130 is disposed in the non-active area NA.

The second part P2 of the non-active area NA can be an area which encloses the first part P1 of the non-active area NA. The second part P2 of the non-active area NA can be disposed to be adjacent to the first part P1 of the non-active area NA and enclose the first part P1 of the non-active area NA. The second part P2 of the non-active area NA can be an area in the non-active area NA in which the planarization layer 130 is not present. For example, the planarization layer 130 may have been etched to be removed.

The first part P1 of the non-active area NA can extend from the planarization layer 130 disposed in the active area AA. The second part P2 of the non-active area NA can include an end (or one side) of the light emitting display apparatus from an end point (or one side) of the planarization layer 130. The second part P2 can be disposed outward of the first part P1, and can enclose the first part P2 of the non-active area, as well as the active area AA. A boundary between the first part P1 and the second part P2 can be defined, for example by defining the boundary as where the planarization layer 130 ceases to be present in the non-active area NA.

The substrate 110 can support various components of the display apparatus. The substrate 110 can be formed of a glass or a plastic material having flexibility.

When the substrate 110 is formed of a plastic material, for example, when the substrate 110 is formed of polyimide, the manufacturing process of the light emitting display apparatus is performed under a circumstance when a support substrate formed of glass is disposed below the substrate 110 and the support substrate can be released after completing the manufacturing process of the light emitting display apparatus. Further, after releasing the support substrate, a back plate which supports the substrate 110 can be disposed below the substrate 110.

When the substrate 110 is formed of polyimide, a moisture component permeates the substrate 110 formed of polyimide so that moisture permeation proceeds to the thin film transistor or the light emitting diode layer to degrade the performance of the light emitting display apparatus. In order to suppress the degradation of the performance of the display apparatus due to the moisture permeation, the display apparatus according to the example embodiment of the present disclosure can be configured by two polyimides. Further, an inorganic layer can be formed between two polyimides (PI) to block the moisture components from permeating the lower polyimide (PI), so that the reliability of the product performance can be improved. The inorganic layer can be formed by a single layer of silicon nitride (SiNx) or silicon oxide (SiOx) or a multilayer thereof.

The substrate 110 can include elements and functional layers formed on the substrate 110 such as a switching element, a driving element (or thin film transistor) connected to the switching element, an organic light emitting diode connected to the driving element (or thin film transistor), and a protection layer. Other layers or structures can be included in the substrate 110.

The buffer layer can be disposed on the entire surface of the substrate 110. The buffer layer can improve the adhesiveness between layers formed on the buffer layer and the substrate and block various types of defects such as alkali components leaked from the substrate 110. Further, the buffer layer can delay the diffusion of moisture or oxygen which permeates the substrate 110.

The buffer layer can be formed by a single layer of silicon nitride (SiNx) or silicon oxide (SiOx) or a multilayer thereof. When the buffer layer is formed of a plurality of layers, silicon oxide (SiOx) and silicon nitride (SiNx) can be alternately formed. Other materials for the buffer layer can be used.

The buffer layer can be omitted based on a type or a material of the substrate 110 and a structure and a type of the thin film transistor.

In the light emitting display apparatus 100 according to the example embodiment, the thin film transistor 120 can be further disposed on the buffer layer. The thin film transistor 120 can include a gate electrode 121, a semiconductor layer 123, a source electrode 125S, and a drain electrode 125D.

The drain electrode 125D is electrically connected to the light emitting diode layer 200 to transmit a current or a signal to the light emitting diode layer 200. Further, the connection electrode 126 is further disposed between the drain electrode 125D and the light emitting diode layer 200 to transmit the current and the signal of the thin film transistor to the light emitting diode layer 200 via the connection electrode 126.

For convenience of explanation, even though the driving thin film transistors is illustrated among various thin film transistor that can be included in the light emitting display apparatus 100, other thin film transistors such as a switching thin film transistor can be included in the light emitting display apparatus 100. And, for convenience of explanation, although it has been described that the thin film transistor 120 has a bottom gate structure, it is not limited to this structure and can be implemented in other structures such as a top gate structure.

The gate electrode 121 can be disposed on the buffer layer. The gate electrode 121 can be formed of a single layer or a multi-layer formed of any one of molybdenum (Mo), copper (Cu), titanium (Ti), aluminum (Al), chrome (Cr), gold (Au), nickel (Ni), neodymium (Nd), and tungsten (W) or an alloy thereof. Other materials or alloys can be used for the gate electrode 121.

A first insulating layer 122 can be disposed on the gate electrode 121. The first insulating layer 122 can insulate the gate electrode 121 from the semiconductor layer 123.

The first insulating layer 122 can be formed of an insulating material such as silicon nitride (SiNx) or silicon oxide (SiOx) or other insulating organic or inorganic material.

The semiconductor layer 123 is disposed on the first insulating layer 122. The semiconductor layer 123 can be made of poly silicon (p-Si). In this case, a predetermined region can be doped with impurities. Further, the semiconductor layer 123 can be made of amorphous silicon (a-Si) or various organic semiconductor materials such as pentacene. As another example, the semiconductor layer 123 can be made of oxide.

The second insulating layer 124 can be disposed on the semiconductor layer 123. The second insulating layer 124 can be formed of an insulating material such as silicon nitride (SiNx) or silicon oxide (SiOx) or other insulating organic or inorganic material. The second insulating layer 124 is selectively removed to form a contact hole in which the source electrode 125S and the drain electrode 125D are disposed.

The source electrode 125S and the drain electrode 125D can be disposed on the second insulating layer 124.

The source electrode 125S and the drain electrode 125D can be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. For example, the source electrode 125S and the drain electrode 125D can be formed by a triple-layered structure of titanium (Ti)/aluminum (Al)/titanium (Ti) formed of a conductive metal material, but is not limited thereto.

The source electrode 125S and the drain electrode 125D are electrically connected to the semiconductor layer 123 through the contact hole of the second insulating layer 124.

The planarization layer 130 can be disposed on the source electrode 125S and the drain electrode 125D.

The planarization layer 130 can be disposed to cover the thin film transistor 120. The planarization layer 130 can protect the driving element disposed therebelow and relieve or planarize a step or an elevation change due to various layer patterns.

The planarization layer 130 can be formed of at least one of an acrylic resin, an epoxy resin, a phenol resin, a polyamide resin, a polyimide resin, an unsaturated polyester resin, a polyphenylene resin, and a polyphenylene sulfide resin, but is not limited thereto.

The planarization layer 130 can be disposed in the active area AA and a part of the non-active area NA. For example, the planarization layer 130 can extend from the active area AA to the first part P1 of the non-active area NA.

The planarization layer 130 is etched in the non-active area NA to form a step or an elevation change.

In the non-active area NA, a part of the non-active area NA where the planarization layer 130 is not removed by the etching process can be defined the first part P1. A part of the non-active area NA where the planarization layer 130 is removed by the etching process can be defined as the second part P2.

The planarization layer 130 can be disposed as a single layer, but can be disposed as two or more layers in consideration of the placement of the electrode.

This is because as the light emitting display apparatus 100 evolves to have a higher resolution, various signal lines are increased. Therefore, it is difficult to dispose all the wiring lines on one layer while ensuring a minimum interval so that an additional layer is provided. There is a margin in the placement of the wiring line by providing such an additional layer, which makes it easier to design the electric wire/electrode placement. Further, when a dielectric material is used for the planarization layer 130 configured by a plurality of layers, the planarization layer 130 can be utilized to form a capacitance between metal layers.

When two planarization layers 130 are provided, the planarization layers can include a lower planarization layer 140 and an upper planarization layer 150. But such is not limited thereto, and additional layers can be included in the planarization layer 130.

The connection electrode 126 can be disposed between the lower planarization layer 140 and the upper planarization layer 150.

The contact hole is formed in the lower planarization layer 140 and the connection electrode 126 is further disposed in the contact hole so that the thin film transistor 120 and the light emitting diode layer 200 can be electrically connected by the connection electrode 126.

For example, one end (or a part) of the connection electrode 126 can be connected to the thin film transistor 120 and the other end (or the other part) of the connection electrode 126 can be connected to the light emitting diode layer 200.

The light emitting diode layer 200 can be disposed on the planarization layer 130. The light emitting diode layer 200 includes an anode electrode 210, an emission layer 230, and a cathode electrode 240. Such a light emitting diode layer 200 can be formed by sequentially disposing the anode electrode 210, the emission layer 230, and the cathode electrode 240 on the planarization layer 130.

The anode electrode 210 can be formed in the contact hole which passes through the planarization layer 130 or above the planarization layer 130. The anode electrode 210 can be electrically connected to the drain electrode 125D through the contact hole.

When the light emitting display apparatus 100 further includes the connection electrode 126, the anode electrode 210 can be electrically connected to the drain electrode 125D via the connection electrode.

The anode electrode 210 can supply holes to the emission layer 230 and can be formed of a conductive material. The conductive material can be one having a high work function.

When the light emitting display apparatus 100 is a top emission type, the anode electrode 210 can be disposed using an opaque conductive material as a reflective electrode which reflects light. For example, the anode electrode 210 can be formed of at least one of silver (Ag), aluminum (Al), gold (Au), molybdenum (Mo), tungsten (W), chrome (Cr), or an alloy thereof. Other metal or alloys can be used.

For example, the anode electrode 210 can be formed with a triple-layered structure of silver (Ag)/lead (Pb)/copper (Cu), but is not limited thereto.

When the light emitting display apparatus 100 is a bottom emission type, the anode electrode 210 can be disposed using a transparent conductive material through which light passes.

For example, the anode electrode can be formed of at least one of indium tin oxide (ITO) and indium zinc oxide (IZO). Other compounds or conductive materials can be used.

A bank layer 220 can be disposed on the planarization layer 130 or the anode electrode 210 in the active area AA and the non-active area NA.

The bank layer 220 can divide the plurality of sub pixels SP, minimize the glaring phenomenon, and suppress color mixture at various viewing angles.

The bank layer 220 can be disposed in an area on the planarization layer 130 or the anode electrode 210 excluding an emission area of the anode electrode 210. The bank layer 220 can have a bank hole which exposes a portion of the anode electrode 210 corresponding to the emission area.

The bank layer 220 can be formed of at least one of an inorganic insulating material such as silicon nitride (SiNx) or silicon oxide (SiOx) and an organic insulating material such as benzocyclobutene (BCB), an acrylic resin or an imide resin.

A spacer can be further disposed on the bank layer 220. The spacer can minimize the light emitting display apparatus 100 from being broken due to the external impact by buffering an empty space between the substrate 110 on which the light emitting diode layer 200 is formed and the upper substrate. The spacer can be formed of the same material as the bank layer 220 and simultaneously formed with the bank layer 220, but is not limited thereto.

A first pattern 400 and a second pattern 500 can be disposed in the non-active area NA of the light emitting display apparatus 100.

The first pattern 400 and the second pattern 500 can suppress the limitations such as a driving failure caused when the second protection layer 320 of the protection layer 300 intrudes into an area of the non-active area NA in which the driving circuit is formed. Among the first pattern 400 and the second pattern 500, at least the first pattern 400 can be on the planarization layer 130, and can be further disposed on the bank layer 220, which can be the same layer on which the spacer is disposed. However, such is not required, and the first pattern 400 can be disposed on a different layer from that of the spacer, as long as at least the first pattern 400 can be located in the non-active area NA and on or above the planarization layer 130. In various embodiments of the present invention, more than one first pattern 400 and more than one second pattern 500 can be provided.

A material which configures the second protection layer 320 is an organic material (polymer) and is applied on the substrate 110 in a liquid state and then hardened to form the second protection layer 320. The organic material has a low viscosity so that it can be in the liquid state having a high density before being hardened. Accordingly, the organic material has a fluidity to flow in an area in which the driving circuit is formed in the non-active area of the light emitting display apparatus 100. When the organic material intrudes into the area in which the driving circuit is formed, there can be a limitation in that a driving failure or a lighting test failure is caused.

Therefore, the inventors of the present disclosure conducted several experiments to reduce the flow of the organic material until the second protection layer 320 was hardened. The inventors invented a light emitting display apparatus 100 which minimized the flow of the organic material of the second protection layer 320 of the light emitting display apparatus and minimized the driving failure caused by the invasion of the second protection layer 320 in an area of the non-active area NA in which the driving circuit was formed, through several experiments.

The first pattern 400 and the second pattern 500 can control the flowability of the organic material of the second protection layer 320. First, the flow of the organic material of the second protection layer 320 is controlled by the first pattern 400 adjacent to the active area AA. When the organic material overflows the first pattern 400, secondarily, the second pattern 500 can block the spreading (or flowing) of the organic material of the second protection layer 320 into the driving circuit in the non-active area.

The first pattern 400 can be disposed along the periphery of the active area AA. For example, the first pattern 400 can be disposed outward of the active area AA to enclose the active area AA.

The first pattern 400 can be disposed in the first part P1 of the non-active area NA. For example, the first pattern 400 can be disposed on the planarization layer 130 of the non-active area NA which extends from the active area AA.

Since the first pattern 400 is disposed on the planarization layer 130 of the first part P1, the first pattern 400 is disposed in a higher position than the second pattern 500 and is formed to be more adjacent to the active area AA to more efficiently control the flow of the organic material of the second protection layer 320.

Further, even though the second pattern 500 is disposed in the second part P2 of the non-active area NA, a moving speed of the organic material of the second protection layer 320 can be increased due to a height and an inclination of a step or an elevation drop formed by etching a plurality of planarization layers, insulating layers, and metal lines in the non-active area NA. Therefore, there is a limitation in that the second protection layer 320 spreads (or flows) to the driving circuit of the non-active area NA before being hardened.

However, the first pattern 400 is disposed in the first part P1 of the non-active area NA to primarily suppress or reduce the flow of the organic material of the second protection layer 320. Accordingly, an amount of the second protection layer 320 which overflows or overtops the first pattern 400 is reduced and a spreading (or flowing) speed of the second protection layer 320 is reduced so that a spreading (or flowing) distance of the second protection layer 320 can be controlled. Therefore, the limitation of the driving failure which may be caused by the second protection layer 320 which intrudes into the non-active area NA can be suppressed.

Further, the spreading (or flowing) distance of the second protection layer 320 is minimized to minimize a design margin of the second protection layer 320 so that a light emitting display apparatus which has a thin bezel and has an improved reliability can be provided.

Since the first pattern 400 is disposed on the planarization layer 130, the flow of the organic material of the protection layer 320 in the first pattern 400 disposed in the non-active area NA adjacent to the active area AA is blocked so that the thickness of the protection layer 320 can be increased after being hardened. The protection layer 300 having an increased thickness can efficiently block moisture and oxygen flowing from a side surface of the light emitting display apparatus 100.

At least one first pattern 400 can be disposed. Even though in FIG. 1, one first pattern is illustrated, it is not limited thereto.

The first pattern 400 can be disposed as a plurality of layers using at least one material. For example, the first pattern can include at least one material used to dispose the bank layer 220 and the spacer.

The second pattern 500 can block the organic material of the second protection layer 320 which is not controlled by the first pattern 400 from spreading (or flowing) to the driving circuit of the non-active area.

The second pattern 500 can be disposed in the second part P2 of the non-active area NA. For example, the second pattern 500 can be disposed on the second part P2 which is an area in which the planarization layer 130 of the non-active area NA is not present because the planarization layer 130 has been etched to be removed.

The second pattern 500 can be spaced apart from the first pattern 400 formed in the first part P1 of the non-active area NA and can be disposed along a periphery of the first pattern 400.

At least one second pattern 500 can be disposed. Even though in FIG. 1, one second pattern 500 is illustrated, it is not limited thereto as there can be more than one second pattern 500.

The second pattern 500 can be disposed as at least one layer using at least one material. For example, the second pattern 500 can include at least one material used to dispose the planarization layer 130, the bank layer 220 and the spacer.

The emission layer 230 can be disposed on the anode electrode 210. The emission layer 230 can be a layer configured by an organic material which emits light with a specific color. For example, the emission layer 230 can be configured by at least one of a red organic emission layer, a green organic emission layer, a blue organic emission layer, and a white organic emission layer. When the emission layer 230 is configured by the white organic emission layer, a color filter can be further disposed above the light emitting diode layer 200 to provide light of a specific color.

In addition to the emission layer 230, a hole injection layer, a hole transport layer, an electron transport layer, and an electron injection layer can be included. Also, additional layers or different layers can be included or provided for the light emitting diode layer 200.

The cathode electrode 240 can be disposed on the emission layer 230. The cathode electrode 240 supplies electrons to the emission layer 230 and can be formed of a conductive material. The conductive material can be one having a low work function.

When the light emitting display apparatus 100 is a top emission type, the cathode electrode 240 can be disposed using a transparent conductive material through which light passes. For example, the cathode electrode can be formed of at least one of indium tin oxide (ITO) and indium zinc oxide (IZO).

Further, the cathode electrode can be disposed using an opaque conductive material through which light cannot pass. For example, the cathode electrode 240 can be formed of at least one of alloys such as LiF/Al, CsF/Al, Mg:Ag, Ca/Ag, Ca:Ag, LiF/Mg:Ag, LiF/Ca/Ag, and LiF/Ca:Ag. Other alloy or compounds can be used as well for the cathode electrode 240.

When the light emitting display apparatus 100 is a bottom emission type, the cathode electrode 240 can be disposed using an opaque conductive material as a reflective electrode which reflects light. For example, the cathode electrode 240 can be formed of at least one of silver (Ag), aluminum (Al), gold (Au), molybdenum (Mo), tungsten (W), chrome (Cr), or an alloy thereof.

The protection layer 300 can be disposed on the light emitting diode layer 200. The protection layer 300 can be disposed in the active area AA and a part of the non-active area NA of the light emitting display apparatus 100.

The protection layer 300 suppresses the permeation of the oxygen and moisture from the outside to suppress the oxidation of a light emitting material and an electrode material. The protection layer 300 can include a first protection layer 310, a second protection layer 320, and a third protection layer 330 which block the permeation of moisture or oxygen.

The first protection layer 310, the second protection layer 320, and the third protection layer 330 are alternately laminated. The protection layer 300 can be formed of a transparent material to transmit light emitted from the emission layer 230. Accordingly, the second protection layer 320 can be disposed in the active area AA, in the second part P2 of the non-active area NA or both. Also, the protection layer 300 inward of the first pattern 400 and the protection layer 300 outward of the first pattern 400 can have an elevation difference, and a thickness difference of the second protection layer 320 in the first part P1 and the second part P2 of the non-active area NA can be a reason for the elevation difference. Meanwhile, a thickness of the second protection layer 320 can change in extending outward from the active area AA to the non-active area NA. Nevertheless, the second protection layer 320 need not be disposed outward of the second pattern 500.

The first protection layer 310 and the third protection layer 330 can be formed of at least one inorganic material among silicon nitride (SiNx), silicon oxide (SiOx), and aluminum oxide (AlyOz). The first protection layer 310 and the third protection layer 330 can be formed using a vacuum film forming method such as chemical vapor deposition (CVD) or atomic layer deposition (ALD), but are not limited thereto.

The second protection layer 320 can cover impurities, foreign materials or particles which can be generated during a manufacturing process. Further, the second protection layer 320 can planarize a surface of the first protection layer 310. For example, the second protection layer 320 can be a particle cover layer, but is not limited to this terminology.

The second protection layer 320 can be an organic material, for example, a polymer such as silicon oxy carbon (SiOCz), epoxy, polyimide, polyethylene, or acrylate. For example, the second protection layer 320 can be a polymer material having a viscosity of 20 or lower. Viscosity of 20 or higher may be used based on presence of the second pattern 500.

The second protection layer 320 can be formed of a thermosetting material or a photocurable material which is hardened by heat or light.

The second protection layer 320 can be formed by various methods such as inkjet coating or slit coating. For example, the second protection layer 320 can be formed on the first protection layer 310 by spraying or dropping a liquid organic material on the first substrate 110 on which the first protection layer 310 is formed, in the active area AA using an inkjet device or a nozzle coating device. A fluid organic material can be formed in an applying area while the spraying nozzle moves on the applying area (or a nozzle is fixed and a subject moves).

After spraying or dropping the organic material, a solvent and moisture are removed by performing a drying process and a hardening process on the organic material to form a hardened second organic protection layer 320.

When the liquid organic material is sprayed or dropped on the first substrate 110 in the active area AA, the first pattern 400 formed in the first part P1 of the non-active area NA which encloses the active area AA can effectively block the flow of the organic material of the second protection layer. In embodiments of the present disclosure, a surface of the protection layer 300 in the first part p1 can have a planar portion where the surface is essentially flat. Meanwhile, the surface of the protection layer 300 between the first pattern 400 and the second pattern 500 can include an uneven portion where the surface is not completely flat or can include irregularities. Based on the flatness of the protection layer 300, a thickness of the protection layer 300 in the first part P1 can be different from a thickness of the protection layer 300 between the first pattern 400 and the second pattern 500 in the second part P2.

Meanwhile, when a material of the anode electrode 210 is disposed in the non-active area NA, the second pattern 500 can be disposed on the material of the anode electrode 210 in the non-active area NA. The material of the anode electrode 210 in the non-active area NA can be referred to as an auxiliary electrode or an auxiliary pattern. The auxiliary electrode can be electrically isolated from the anode electrode 200, and current need not flow in the auxiliary electrode, but such is not required. In other embodiments, the auxiliary electrode can be electrically connected to another structure, such as the anode electrode 200, or a current may flow in the auxiliary electrode. The material of the anode electrode 210 in the non-active area NA can be continuous or discontinuous in the non-active area NA, whereby the material of the anode electrode 210 in the non-active area NA can be present in all of the non-active area NA or in discrete portions or a portion of the non-active area NA. The second pattern 500 can be on or in contact (such as entirely or partially) with at least a portion of the material of the anode electrode 210 in the non-active area NA. In various embodiments of the present disclosure, the material of the anode electrode 210 in the non-active area NA can be on or in contact (such as entirely or partially) with at least one of a bottom, a side, a top of the second pattern 500. Meanwhile, the material of the anode electrode 210 in the non-active area NA can be located above, below or through the second pattern 500. For example, the material of the anode electrode 210 in the non-active area NA can cover, partially cover, or be interposed between segments of the second pattern 500.

Figure 4A:
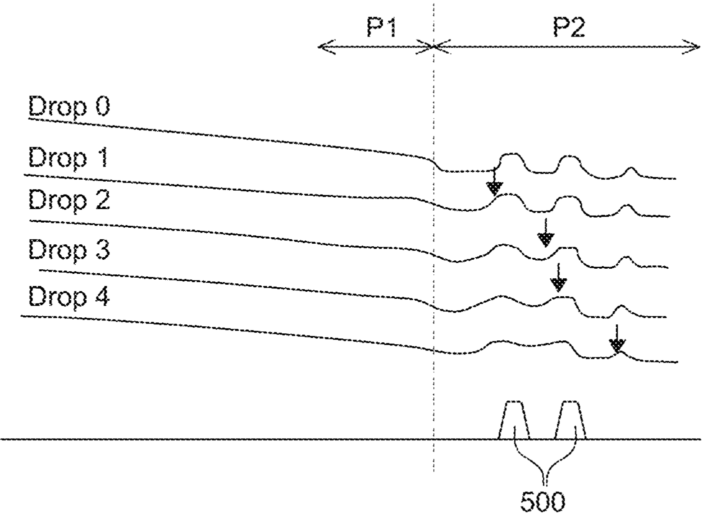
FIG. 4A is a cross-sectional view illustrating a second protection layer of a light emitting display apparatus in which a first pattern is not formed.

FIG. 4A is a cross-sectional view illustrating a second protection layer of a light emitting display apparatus in which a first pattern is not formed.

Figure 4B:
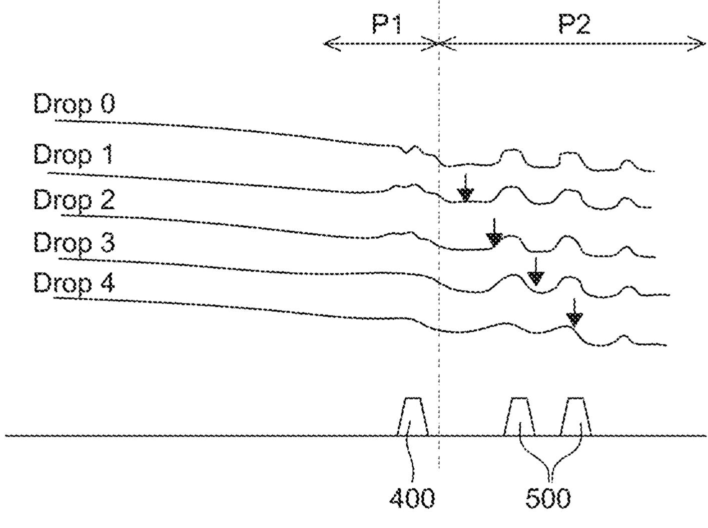
FIG. 4B is a cross-sectional view illustrating a second protection layer of a light emitting display apparatus according to an example embodiment of the present disclosure in which a first pattern is formed.

FIG. 4B is a cross-sectional view schematically illustrating a second protection layer of a light emitting display apparatus according to an example embodiment of the present disclosure in which a first pattern is formed.

More specifically, FIGS. 4A and 4B are profiles illustrating a second protection layer 320 formed according to the number of times of dropping a liquid organic material using an inkjet device or a nozzle coating device.

In FIGS. 4A and 4B, Drop 0 illustrates that no organic material is dropped. Drop 1 illustrates that one drop of organic material is dropped and Drop 2 illustrates that two drops of organic material are dropped. Drop 3, Drop 4, and Drop 5 illustrate that three drops, four drops, and five drops are dropped, respectively.

An arrow of FIGS. 4A and 4B indicates an end point of the second protection layer 320.

When a substrate in which the first pattern 400 is formed and a substrate in which the first pattern 400 is not formed are compared, it is confirmed that the second protection layer 320 of the substrate 110 in which the first pattern 400 is formed slightly spreads (or flows) in the non-active area NA of the substrate 110.

The following Table 1 is a table obtained by measuring a spreading distance of the second protection layer 320 of FIGS. 4A and 4B from the planarization layer 130 to an outer peripheral direction of the light emitting display apparatus 100.

In a comparative example of the following Table 1, the distance is measured from a substrate 110 in which the first pattern is not formed and a first pattern of an example embodiment is measured from a substrate 110 in which the first pattern 400 is formed.

The larger the number of drops, the larger the spreading (or flowing) distance of the second protection layer 320. However, it is confirmed that as compared with the substrate 110 in which the first pattern 400 is not formed, the length of the second protection layer 320 of the substrate in which the first pattern 400 is formed is reduced by 27% on average.

TABLE 1

| Number of Drops | Comparative Embodiment | First pattern (Exemplary Embodiment) |
|---|---|---|
| 1 | 48 μm | 16 μm |
| 2 | 91.5 μm | 50.5 μm |
| 3 | 124 μm | 89.5 μm |
| 4 | 172 μm | 126 μm |
| 5 | 215 μm | 157.5 μm |

Figure 5A:
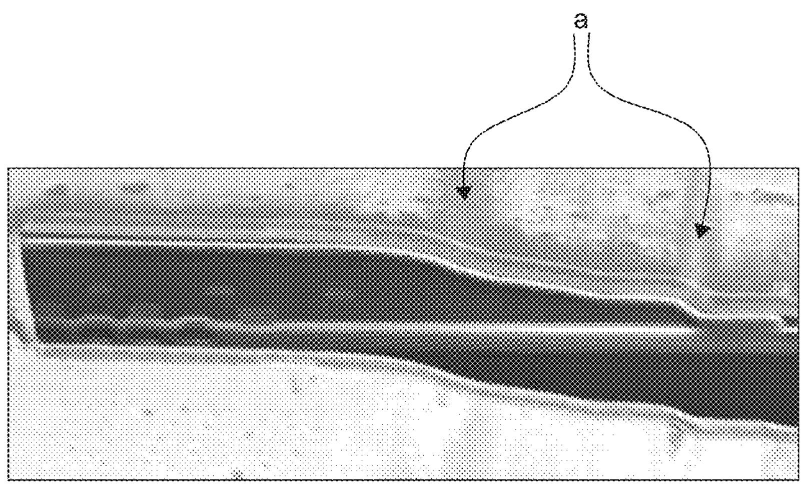
FIG. 5A is a microphotograph of a cross-section of a protection layer of a light emitting display apparatus in which a first pattern is not formed.

FIG. 5A is a microphotograph of a cross-section of a protection layer of a light emitting display apparatus in which a first pattern is not formed.

Figure 5B:
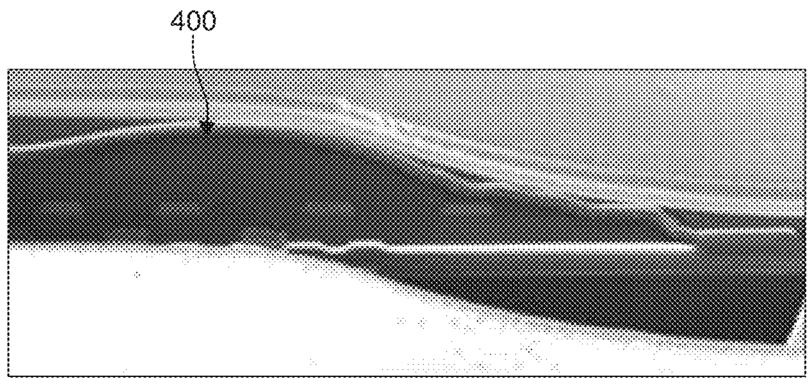
FIG. 5B is a microphotograph of a cross-section of a second protection layer of a light emitting display apparatus according to an example embodiment of the present disclosure in which a first pattern is formed.

FIG. 5B is a microphotograph of a cross-section of a second protection layer of a light emitting display apparatus in which a first pattern of FIG. 3 is formed.

A material which configures the second protection layer 320 has a low viscosity characteristic so that it can be in a liquid state having a high density until the material is hardened. In FIG. 5B, it is confirmed that the first pattern 400 is enclosed to be adjacent to the active area AA so that an amount of the second protection layer 320 which spreads (or flows) in the non-active area NA is minimized.

Further, the spreading (or flowing) distance of the second protection layer 320 is minimized to minimize a design margin of the second protection layer 320 so that a light emitting display apparatus which has a thin bezel and has an improved reliability can be provided.

Further, there is a limitation in that the spreading (or flowing) speed of the second protection layer 320 is increased due to a high step (a) formed by etching the planarization layer 130 in the non-active area NA adjacent to the active area AA in FIG. 5A so that the second protection layer spreads (or flows) before being hardened.

According to the example embodiment of the present disclosure, the first pattern 400 is disposed to make the inclination of the second protection layer 320 gentle to reduce the spreading (or flowing) speed of the second protection layer 320.

Therefore, the limitation of the driving failure which is caused by the second protection layer 320 which intrudes into the non-active area NA can be suppressed.

Hereinafter, another example embodiment of the present disclosure will be described with reference to FIGS. 1, 2, and 6.

Figure 6:
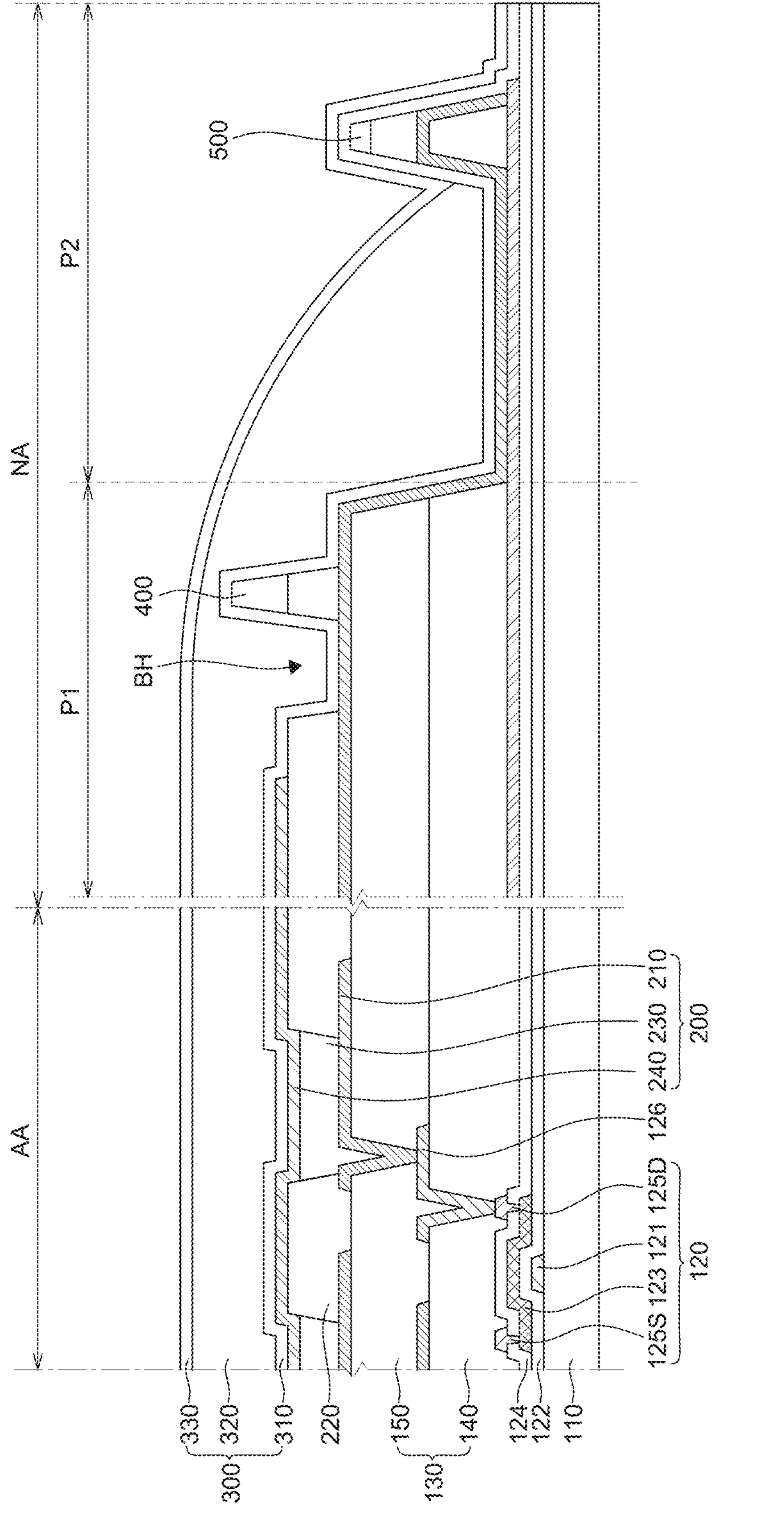
FIG. 6 is a cross-sectional view of a light emitting display apparatus according to another example embodiment of the present disclosure.

A light emitting display apparatus 100 of FIG. 6 is substantially the same as the display apparatus of FIG. 3 except for a buffer hole BH so that a redundant description will be omitted or is briefly provided.

FIG. 6 is a cross-sectional view of a light emitting display apparatus according to another example embodiment of the present disclosure.

Referring to FIG. 6, a light emitting display apparatus 100 according to another example embodiment of the present disclosure includes a substrate 110 which includes an active area AA and a non-active area NA, a planarization layer 130, a protection layer 300, a first pattern 400, a second pattern 500, and a buffer hole BH.

The buffer hole BH can be disposed on the planarization layer 130 or the anode electrode 210 in the first part P1 of the non-active area NA.

The buffer hole BH can be disposed along the periphery of the active area AA. For example, the buffer hole BH can be disposed between the active area AA and the first pattern 400. For example, the buffer hole BH can be disposed on the boundary between the active area AA and the first pattern 400. Moreover, the buffer hole BH can be disposed between the bank layer 220 and the first pattern 400. The buffer hole BH can be a hole or a first hole, but is not limited to the terminology.

The buffer hole BH can be formed by the same process as the bank hole of the active area AA, but is not limited thereto.

At least one buffer hole BH can be disposed. For example, the buffer hole BH is formed by etching the bank layer 220 to suppress the overflowing of the organic material of the second protection layer 320 beyond the first pattern 400. For example, the buffer hole BH is configured so that an amount of the organic material of the second protection layer 320 overflowing or overtopping the first pattern 400 is reduced and a spreading (or flowing) distance of the organic material of the second protection layer 320 can be further effectively controlled. Accordingly, the buffer hole BH is configured so that the limitation of the driving failure which is caused by the second protection layer 320 which intrudes into the non-active area NA can be suppressed. Further, a buffer space can be ensured in consideration of a deviation of an applied amount of the second protection layer 320 so that a light emitting display apparatus which has a thin bezel can be provided by minimizing a design margin of the second protection layer 320.

Hereinafter, another example embodiment of the present disclosure will be described with reference to FIGS. 1, 2, and 7.

Figure 7:
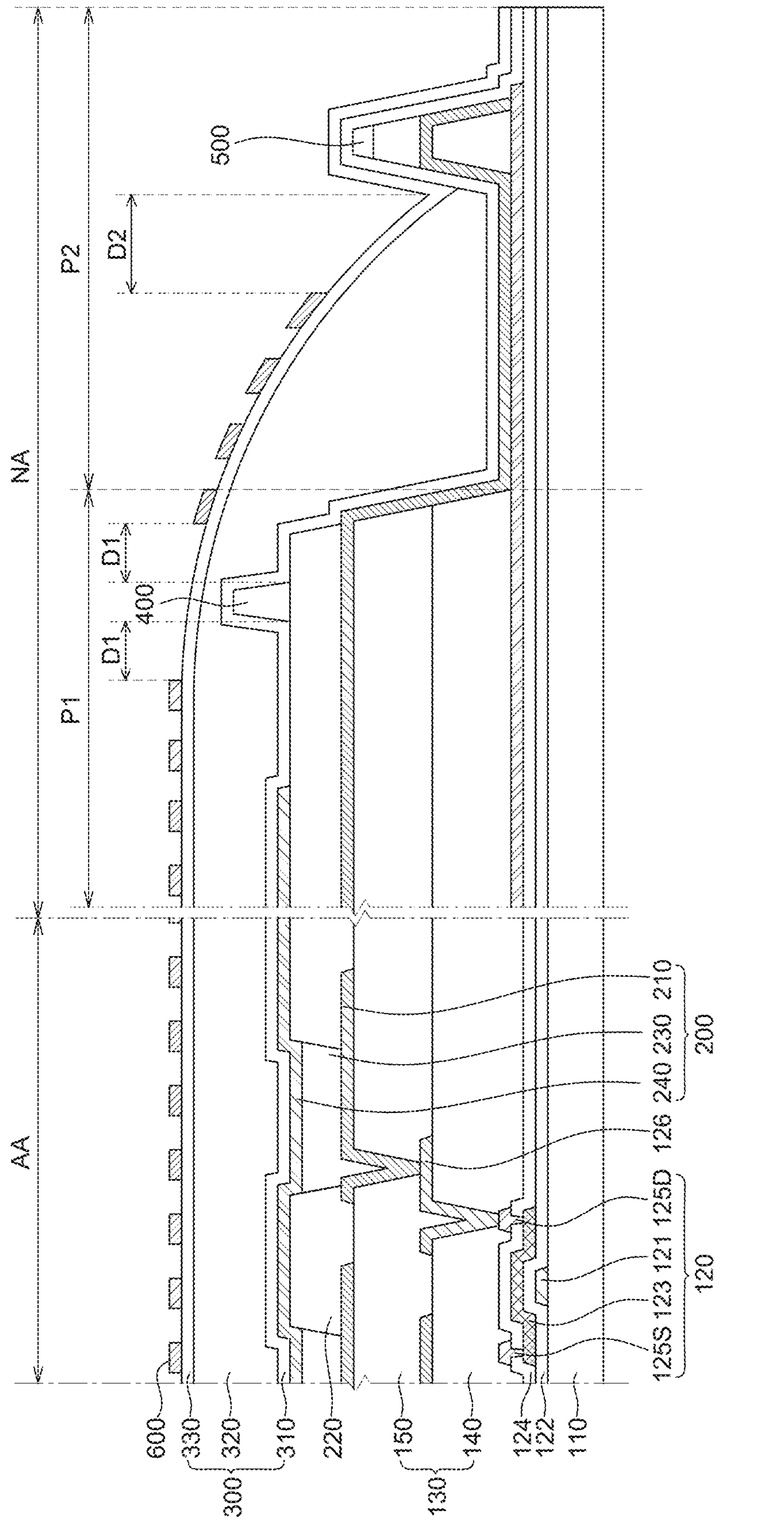
FIG. 7 is a cross-sectional view of a light emitting display apparatus according to another example embodiment of the present disclosure.

A light emitting display apparatus 100 of FIG. 7 is substantially the same as the display apparatus of FIG. 3 except for a touch line 600 so that a redundant description will be omitted or will be briefly provided.

FIG. 7 is a cross-sectional view of a light emitting display apparatus according to another example embodiment of the present disclosure.

Referring to FIG. 7, a touch line 600 can be disposed on the protection layer 300. The touch line 600 can be formed of at least one transparent conductive material among indium tin oxide (ITO), indium zinc oxide (IZO), and silver nano wire (AgNW) to allow light emitted from the light emitting diode layer 200 disposed below the touch line 600 to be transmitted.

According to another example embodiment of the present disclosure, a touch buffer layer can be further included between the protection layer 300 and the touch line 600.

The touch buffer layer can suppress the damage of the protection layer 300 and block an interference signal which can be generated when the touch line 600 is driven.

The touch buffer layer can be formed by a single layer of silicon nitride (SiNx) or silicon oxide (SiOx) or a multilayer thereof, but is not limited thereto.

The touch line 600 can further include a first touch electrode and a second touch electrode.

A mutual capacitance Cm can be formed between the first touch electrode and the second touch electrode.

The mutual capacitance Cm charges electric charges by a touch driving pulse supplied to the second touch electrode and discharges the charged electric charges to the first touch electrode to serve as a touch sensor.

The light emitting display apparatus having a touch sensor displays images by means of a plurality of sub pixels SP having a light emitting diode layer 200 during a display period. Further, the light emitting display apparatus having a touch sensor senses the presence of touch and a touch position by sensing a variation of a mutual capacitance Cm (touch sensor) by the touch of the user during a touch period. For instance, the first touch electrode and the second touch electrode may be configured to sense the presence of a touch and the position of the touch on the display apparatus by sensing a change in the mutual capacitance Cm between the first touch electrode and the second touch electrode.

The light emitting display apparatus 100 in which a plurality of touch lines 600 is disposed on the protection layer 300 has a limitation in that a touch sensitivity at an outer peripheral area of the light emitting display apparatus 100 is lowered due to a low thickness and/or steep inclination and step of the protection layer 300 in the non-active area NA adjacent to the active area AA of the light emitting display apparatus 100. For example, the protection layer 300 of the active area AA has a uniform thickness. To the contrary, in the protection layer 300 formed in the non-active area NA adjacent to the active area AA, a steep inclination and step can be formed because the planarization layer, the insulating layer, and the metal line disposed below the protection layer 300 are etched. Therefore, there is a limitation in that the moving speed of the organic material of the second protection layer 320 is increased so that a thickness is reduced before the second protection layer 320 is hardened and the second protection layer 320 is not applied.

The protection layer 300 formed to have a small thickness in the non-active area NA adjacent to the active area AA causes the electric field interference of the electrodes and the wiring lines disposed above and below the protection layer 300, which results in the degradation of the display quality and the lowering of the touch sensitivity.

Further, when the touch line 600 is manufactured with the steep inclination and step of the protection layer 300 in the non-active area NA, if the touch line 600 is formed in an area in which the inclination or the step of the protection layer 300 is formed, there is a limitation such as the loss or disconnection of the touch line.

Therefore, the inventors of the present disclosure conducted several experiments to reduce the lowering of the display quality and the touch sensitivity in the non-active area NA adjacent to the active area AA. Several experiments have been conducted to improve a display quality and improve a touch sensitivity by minimizing electric field interference of the electrodes disposed above and below the protection layer 300 in the non-active area NA adjacent to the active area AA.

The first pattern 400 formed in the first part P1 of the non-active area NA adjacent to the active area AA suppresses the flow of the organic material of the second protection layer 320 to make the thickness of the second protection layer 320 formed in the first part P1 large. The protection layers 320 are formed to have similar thicknesses in the first parts P1 in the active area AA and the non-active area NA. Therefore, it is possible to suppress the increase of the parasitic capacitance Cp formed in the non-active area NA adjacent to the active area AA in the related art and improve the display quality and a sensitivity of the touch sensing.

The touch line 600 can be disposed to be spaced apart from a part of at least one of the first pattern 400 and the second pattern 500 on the protection layer 300.

The touch line 600 can be spaced apart from the first pattern 400 with a first distance D1 and the first distance D1 can be 10 μm or larger.

The touch line 600 can be spaced apart from the second pattern 500 with a second distance D2 and the second distance D2 can be 50 μm or larger. With reference to FIG. 7, a plurality of touch lines 600 can be disposed on the protection layer 300 in the second part P2 of the non-active area NA, and can sequentially have a decreasing elevation in a direction away from the first part P1 of the non-active area NA.

The buffer hole BH can be further disposed on the planarization layer 130 or the anode electrode 210 in the first part P1 of the non-active area NA.

The buffer hole BH can be disposed along the periphery of the active area AA. The buffer hole BH can be formed between the active area AA and the first pattern 400.

At least one buffer hole BH can be disposed. For example, the buffer hole BH is formed by etching the bank layer 220 to suppress the overflowing of the organic material of the second protection layer 320 beyond the first pattern 400. For example, an amount of the organic material of the second protection layer 320 overflowing the first pattern 400 is reduced and a spreading (or flowing) distance of the organic material of the second protection layer 320 can be further effectively controlled. Accordingly, the buffer hole BH is configured so that the limitation of the driving failure which is caused by the second protection layer 320 which intrudes into the non-active area NA can be suppressed. Further, since the buffer hole BH is configured, a buffer space can be ensured in consideration of a deviation of an applied amount of the second protection layer 320 so that a light emitting display apparatus which has a thin bezel can be provided by minimizing a design margin of the second protection layer 320.

Figure 8:
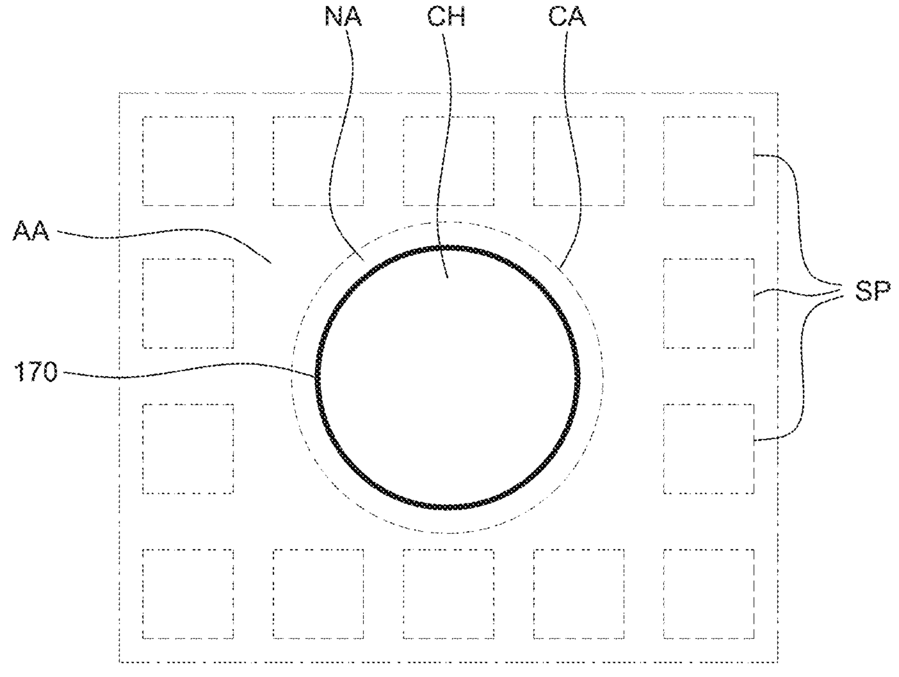
FIG. 8 is an enlarged plan view of a camera area of FIG. 1.

FIG. 8 is an enlarged plan view of a camera area of FIG. 1.

A light emitting display apparatus 100 of FIG. 8 is substantially the same as the light emitting display apparatus of FIG. 2 except for a light shielding member 170 disposed in a camera area CA in a display panel, so that a redundant description will be omitted or will be briefly provided.

Referring to FIG. 8, a camera area CA is disposed in the active area AA. The camera area CA is disposed between the plurality of sub pixels SP in the active area AA. The camera area CA is an area in which an optical component such as a camera or an optical sensor is disposed. The optical sensor can include a proximity sensor, an infrared sensor, and an ultraviolet sensor, but is not limited thereto. The camera area CA includes an optical hole CH which passes through some components of the light emitting display apparatus 100 to dispose the optical components. The optical hole CH which passes through the light emitting display apparatus 100 is formed to ensure a space in which the optical components are disposed.

The optical hole CH can be a hole or a second hole, but is not limited to the terminology.

Some of light emitted from the plurality of sub pixels SP can travel toward the camera area CA disposed between the plurality of sub pixels SP, for example, the optical hole CH. When the light from the plurality of sub pixels SP traveling to the optical hole CH is transmitted to the optical component such as a camera, the noise is generated, which can lower the reliability of the optical component. Accordingly, the light shielding member 170 can be disposed in the optical hole CH to suppress the light emitted from the plurality of sub pixels SP from being transmitted into the optical hole CH.

The non-active area NA can be formed between the active area AA and the camera area CA. Even though it is illustrated that the non-active area NA encloses the camera area CA, a shape of the active area AA and a shape/placements of the non-active area NA adjacent to the active area AA are not limited to the example illustrated in FIG. 8. The active area AA and the non-active area NA can have shapes suitable for a design of an electronic device including the light emitting display apparatus 100. For example, an example shape of the active area AA can be a pentagon, a hexagon, a circle, an oval, or the like, but is not limited thereto.

The non-active area NA disposed in the camera area CA of FIG. 8 has the same cross-sectional structure as the non-active area NA illustrated in FIGS. 3, 6, and 7, and has the same effect.

The light shielding member 170 can be formed of a material having a conductivity. The light shielding member 170 discharges the static electricity while preventing the light leakage. The light shielding member can be formed of a material which is opaque and has electrical conductivity.

The light shielding member 170 can block the light of the light emitting display apparatus 100 from entering into the optical hole CH and discharge the static electricity generated from the front member. The light shielding member 170 can cover at least one of a part of the substrate 110 and a side surface of the non-active area NA exposed through the optical hole CH.

The light shielding member 170 can be formed of a conductive ink or a conductive paste. For example, the light shielding member 170 can be formed of a conductive ink in which conductive particles such as carbon black or a conductive polymer such as PEDOT:PSS (poly(3,4-ethylenedioxythiophene)) are mixed or a conductive paste formed of a material such as silver (Ag). For example, the light shielding member 170 can have a resistance of 0 to $10^6\Omega$ to discharge the static electricity. The light shielding member 170 can be formed of various materials other than the above-described materials, but is not limited thereto.

The light shielding member 170 can be formed using a process such as pneumatic spray coating or electrostatic spray coating. For example, the pneumatic spray coating is a method of spraying by pushing a material in a syringe using a pneumatic press. The electrostatic spray coating is a method of spraying a charged material using a spraying nozzle after applying a voltage to a material to be charged. When the light shielding member 170 is formed by the pneumatic spraying coating or the electrostatic spray coating method, the viscosity of the light shielding member 170 is approximately 10000 cPs or lower, but is not limited thereto. The light shielding member 170 can be formed by various methods other than the above-mentioned method, but is not limited thereto.

The example embodiments of the present disclosure can also be described as follows:

According to an aspect of the present disclosure, there is provided a light emitting display apparatus. The light emitting display apparatus includes a substrate including an active area and a non-active area adjacent to the active area; a planarization layer disposed in the active area and a first part of the non-active area; a light emitting diode layer and a first pattern disposed on the planarization layer; a protection layer disposed on the light emitting diode layer and the first pattern; and a second pattern disposed in a second part adjacent to the first part of the non-active area.

The first pattern can be disposed along a periphery of the active area.

The planarization layer can extend from the active area to the first part of the non-active area.

The light emitting display apparatus can further comprise a hole disposed on the planarization layer. The hole can be disposed in the first part of the non-active area.

The hole can be disposed between the active area and the first pattern.

The light emitting display apparatus can further comprise a spacer disposed on the bank layer. The first pattern can be configured by at least one of the bank layer and the spacer.

The light emitting display apparatus can further comprise a bank layer disposed on the planarization layer and a spacer disposed on the bank layer. The second pattern can be configured by at least one of the planarization layer, the bank layer, and the spacer.

The light emitting display apparatus can further comprise a bank layer disposed on the planarization layer and a touch line disposed on the protection layer.

The touch line can be spaced apart from a part of at least one of the first pattern and the second pattern.

A distance of the touch line from the first pattern can be smaller than a distance of the touch line from the second pattern.

According to another aspect of the present disclosure, there is provided a light emitting display apparatus. The light emitting display apparatus includes a substrate including an active area and a non-active area adjacent to the active area; a planarization layer disposed in the active area and a first part of the non-active area; a light emitting diode layer and a first pattern disposed on the planarization layer; a protection layer disposed on an organic light emitting diode in the light emitting diode layer, and the first pattern; a second pattern disposed in a second part adjacent to the first part of the non-active area; and a touch line disposed on the protection layer.

The touch line can be spaced apart from a part of at least of the first pattern and the second pattern.

A distance of the touch line from the first pattern can be smaller than a distance of the touch line from the second pattern.

The touch line can further include a first touch electrode and a second touch electrode.

A presence of touch and a touch position can be sensed by sensing a variation of a mutual capacitance between the first touch electrode and the second touch electrode.

The first pattern can be disposed along a periphery of the active area.

The planarization layer can extend from the active area to the first part of the non-active area.

The light emitting display apparatus can further comprise a hole disposed on the planarization layer. The hole can be disposed in the first part of the non-active area.

The light emitting display apparatus can further comprise a bank layer disposed on the planarization layer and a spacer disposed on the bank layer. The first pattern can be configured by at least one of the bank layer and the spacer.

The light emitting display apparatus can further comprise a bank layer disposed on the planarization layer and a spacer disposed on the bank layer. The second pattern can be configured by at least one of the planarization layer, the bank layer, and the spacer.

According to yet another aspect of the present disclosure, there is provided a light emitting display apparatus. The light emitting display apparatus includes a substrate including an active area and a non-active area adjacent to the active area; a light emitting diode layer disposed in the active area; a first pattern disposed in a first part of the non-active area; a protection layer disposed on the light emitting diode layer and the first pattern; a second pattern disposed in a second part adjacent to the first part of the non-active area; and a hole disposed in the first part of the non-active area.

A hole can be disposed between the active area and the first pattern.

The light emitting display apparatus can include a bank layer defining an emission area of the light emitting diode layer, and the hole can be disposed between the bank layer and the first pattern.

According to yet another aspect of the present disclosure, a light emitting display apparatus can include a substrate including an active area and a non-active area enclosing the active area; a planarization layer in the active area, and partially intruding into the non-active area; a protection layer in the active area, and partially intruding into the non-active area; and a first pattern interposed between the planarization layer and the protection layer, and disposed in the non-active area.

The non-active area can include a first part that is adjacent the active area, a second part that is outward of the first part, and a boundary between the first part and the second part, and the second part of the non-active area need not include the planarization layer.

The non-active area can include a first part and a second part that is outward of the first part, the first pattern can be disposed in the first part of the non-active area, and protection layer can extend from the active area to the second part of the non-active area by overtopping the first pattern.

The non-active area can include a first part and a second part that is outward of the first part, and a second pattern can be disposed in the second part of the non-active area.

The protection layer can include a first protection layer and a second protection layer, and the second protection layer can have a varying thickness in extending outward from a first part to a second part of the non-active area.

The light emitting display apparatus can further include an anode electrode on the planarization layer, a bank layer on the anode electrode, an emission layer on the anode electrode, and a cathode electrode on the emission layer, a material of the anode electrode can be disposed in a second part of the non-active area that is outward from a first area of the non-active area, and a second pattern can be in the second part and includes the material of the anode electrode in the second part of the non-active area.

The second protection layer need not overtop the second pattern.

A surface of the protection layer inward of the first pattern can include a planar portion, and the surface of the protection layer outward of the first pattern can include an uneven portion.

The non-active area can include a first part and a second part that is outward of the first part, and a plurality of touch lines can be on the protection layer in the first part of the non-active area.

The plurality of touch lines can be further on the protection layer in the second part of the non-active area, and sequentially have a decreasing elevation in a direction outward from the first part of the non-active area.

The light emitting display apparatus can further include an optical hole in the substrate and enclosed by the active area.

Although the example embodiments of the present disclosure have been described in detail with reference to the accompanying drawings, the present disclosure is not limited thereto and can be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto.

Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A light emitting display apparatus, comprising:

a substrate including an active area and a non-active area adjacent to the active area;

a planarization layer disposed in the active area and in a first part of the non-active area;

a light emitting diode layer and a first pattern disposed on the planarization layer;

a protection layer disposed on the light emitting diode layer and the first pattern;

a second pattern disposed in a second part adjacent to the first part of the non-active area; and touch lines disposed on the protection layer, wherein, in a plane view, the touch lines are spaced apart from the first pattern and the second pattern, wherein, in the plane view, a first distance between the first pattern and a touch line among the touch lines and closest to the first pattern is smaller than a second distance between the second pattern and a touch line among the touch lines and closest to the second pattern, and wherein, in the plane view, the touch lines do not overlap the first pattern and the second pattern.

2. The light emitting display apparatus according to claim 1, wherein the first pattern is disposed along a periphery of the active area.

3. The light emitting display apparatus according to claim 1, wherein the planarization layer extends from the active area to the first part of the non-active area.

4. The light emitting display apparatus according to claim 1, further comprising:

a hole disposed on the planarization layer, wherein the hole is disposed in the first part of the non-active area.

5. The light emitting display apparatus according to claim 4, wherein the hole is disposed between the active area and the first pattern.

6. The light emitting display apparatus according to claim 1, further comprising:

a bank layer disposed on the planarization layer, wherein the first pattern includes a material of at least one of the bank layer.

7. The light emitting display apparatus according to claim 1, further comprising:

a bank layer disposed on the planarization layer, wherein the second pattern includes a material of at least one of the planarization layer and the bank layer.

8. The light emitting display apparatus according to claim 1, wherein the touch lines further include a first touch electrode and a second touch electrode.

9. The light emitting display apparatus according to claim 8, wherein a presence of touch and a touch position is sensed by sensing a variation of a mutual capacitance between the first touch electrode and the second touch electrode.

10. The light emitting display apparatus according to claim 1, wherein the first distance is 10 μm or larger, and the second distance is 50 μm or larger.

11. A light emitting display apparatus, comprising:

a substrate including an active area and a non-active area adjacent to the active area;

a light emitting diode layer disposed in the active area;

a first pattern disposed in a first part of the non-active area;

a protection layer disposed on the light emitting diode layer and the first pattern;

a second pattern disposed in a second part adjacent to the first part of the non-active area;

a hole disposed in the first part of the non-active area; and touch lines disposed on the protection layer, wherein, in a plane view, the touch lines are spaced apart from the first pattern and the second pattern, wherein, in the plane view, a first distance between the first pattern and a touch line among the touch lines and closest to the first pattern is smaller than a second distance between the second pattern and a touch line among the touch lines and closest to the second pattern, and wherein, in the plane view, the touch lines do not overlap the first pattern and the second pattern.

12. The light emitting display apparatus according to claim 11, wherein the hole is disposed between the active area and the first pattern.

13. The light emitting display apparatus according to claim 11, further comprising:

a bank layer defining an emission area of the light emitting diode layer, wherein the hole is disposed between the bank layer and the first pattern.

14. A light emitting display apparatus, comprising:

a substrate including an active area and a non-active area enclosing the active area;

a planarization layer in the active area, and partially intruding into the non-active area;

a protection layer in the active area, and partially intruding into the non-active area;

a first pattern interposed between the planarization layer and the protection layer, and disposed in the non-active area;

a second pattern disposed outward of the first pattern; and touch lines disposed on the protection layer, wherein, in a plane view, the touch lines are spaced apart from the first pattern and the second pattern, wherein, in the plane view, a first distance between the first pattern and a touch line among the touch lines and closest to the first pattern is smaller than a second distance between the second pattern and a touch line among the touch lines and closest to the second pattern, wherein, in the plane view, the touch lines do not overlap the first pattern and the second pattern.

15. The light emitting display apparatus according to claim 14, wherein the non-active area includes a first part that is adjacent the active area, a second part that is outward of the first part, and a boundary between the first part and the second part, and wherein the second part of the non-active area does not include the planarization layer.

16. The light emitting display apparatus according to claim 14, wherein the non-active area includes a first part and a second part that is outward of the first part, wherein the first pattern is disposed in the first part of the non-active area, and wherein the protection layer extends from the active area to the second part of the non-active area by overtopping the first pattern.

17. The light emitting display apparatus according to claim 14, wherein the non-active area includes a first part and a second part that is outward of the first part, and wherein the second pattern is disposed in the second part of the non-active area.

18. The light emitting display apparatus according to claim 14, wherein the protection layer includes a first protection layer and a second protection layer, and wherein the second protection layer has a varying thickness in extending outward from a first part to a second part of the non-active area.

19. The light emitting display apparatus according to claim 15, further comprising an anode electrode on the planarization layer, a bank layer on the anode electrode, an emission layer on the anode electrode, and a cathode electrode on the emission layer, wherein a material of the anode electrode is disposed in the second part of the non-active area that is outward from the first part of the non-active area, and wherein the second pattern is in the second part and includes the material of the anode electrode in the second part of the non-active area.

20. The light emitting display apparatus according to claim 18, wherein the second protection layer does not overflow the second pattern.

21. The light emitting display apparatus according to claim 14, wherein a surface of the protection layer inward of the first pattern includes a planar portion, and wherein the surface of the protection layer outward of the first pattern includes an uneven portion.

22. The light emitting display apparatus according to claim 14, wherein the non-active area includes a first part and a second part that is outward of the first part, and wherein the touch lines are on the protection layer in the first part of the non-active area.

23. The light emitting display apparatus according to claim 22, wherein the touch lines are further on the protection layer in the second part of the non-active area, and sequentially have a decreasing elevation in a direction outward from the first part of the non-active area.

24. The light emitting display apparatus according to claim 17, further comprising an optical hole in the substrate and enclosed by the active area.

* * * * *